(12) United States Patent
Miao et al.

(10) Patent No.: US 9,276,204 B2
(45) Date of Patent: Mar. 1, 2016

(54) MEMRISTOR WITH CHANNEL REGION IN THERMAL EQUILIBRIUM WITH CONTAINING REGION

(75) Inventors: Feng Miao, Mountain View, CA (US); Jianhua Yang, Palo Alto, CA (US); John Paul Strachan, Millbrae, CA (US); Wei Yi, Mountain View, CA (US); Gilberto Medeiros Ribeiro, Palo Alto, CA (US); R. Stanley Williams, Portola Valley, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/371,492

(22) PCT Filed: Feb. 29, 2012

(86) PCT No.: PCT/US2012/027101
§ 371 (c)(1),
(2), (4) Date: Jul. 10, 2014

(87) PCT Pub. No.: WO2013/130064
PCT Pub. Date: Sep. 6, 2013

(65) Prior Publication Data
US 2014/0346426 A1 Nov. 27, 2014

(51) Int. Cl.
*H01L 45/00* (2006.01)
*H01L 27/24* (2006.01)

(52) U.S. Cl.
CPC .............. *H01L 45/085* (2013.01); *H01L 45/08* (2013.01); *H01L 45/1233* (2013.01); *H01L 45/1246* (2013.01); *H01L 45/146* (2013.01); *H01L 45/165* (2013.01); *H01L 45/1641* (2013.01); *H01L 27/2463* (2013.01)

(58) Field of Classification Search
None
See application file for complete search history.

(56) References Cited

U.S. PATENT DOCUMENTS

| | | | |
|---|---|---|---|
| 7,700,934 B2 | 4/2010 | Bakkers et al. | |
| 7,791,059 B2 | 9/2010 | Jedema et al. | |
| 7,812,335 B2 | 10/2010 | Scheuerlein | |
| 8,008,648 B2 | 8/2011 | Bratkovski et al. | |
| 2010/0065836 A1 | 3/2010 | Lee | |
| 2010/0243983 A1 | 9/2010 | Chiang et al. | |
| 2010/0259967 A1* | 10/2010 | Yasuda et al. | 365/148 |
| 2011/0017977 A1 | 1/2011 | Bratkovski et al. | |
| 2011/0220862 A1* | 9/2011 | Arita | H01L 27/2409 257/4 |
| 2011/0227022 A1 | 9/2011 | Cho et al. | |
| 2011/0233511 A1* | 9/2011 | Kawashima et al. | 257/4 |
| 2011/0309321 A1* | 12/2011 | Yang et al. | 257/5 |

(Continued)

FOREIGN PATENT DOCUMENTS

WO WO-2011016794 A2 2/2011

OTHER PUBLICATIONS

International Search Report and Written Opinion, Nov. 30, 2012, PCT Patent Application No. PCT/US2012/027101, 9 pages.

(Continued)

*Primary Examiner* — Khaja Ahmad
(74) *Attorney, Agent, or Firm* — Hewlett Packard Enterprise Patent Department

(57) ABSTRACT

A memristor with a channel region in thermal equilibrium with a containing region. The channel region has a variable concentration of mobile ions. The containing region, formed of stoichiometric crystalline material, contains and is in thermal equilibrium with the channel region.

14 Claims, 7 Drawing Sheets

(56) References Cited

U.S. PATENT DOCUMENTS

2012/0012809 A1* 1/2012 Yang ............... H01L 27/101
257/4
2012/0104350 A1* 5/2012 Himeno et al. ............... 257/4

OTHER PUBLICATIONS

Jo, S. H. et al., Si Memristive Devices Applied to Memory and Neuromorphic Circuits, IEEE, 2010, pp. 13-16.

Onkaraiah, S. et al., Using OxRRAM memories for improving communications of re configurable FPGA architectures, Nanoscale Architectures (NANOARCH), 2011 IEEE/ACM International Symposium, Jun. 8-9, 2011, pp. 65-69.

Yang, J.J. et al., Diffusion of Adhesion Layer Metals Controls Nanoscale Memristive Switching, Advanced Materials 2010, 22, pp. 4034-4038.

Yang, J.J. et al., High Switching Endurance in TaOx Memristive Devices, Applied Physics Letters 97, 232102 (2010), pp. 232102-1-232102-3.

* cited by examiner

US 9,276,204 B2

MEMRISTOR WITH CHANNEL REGION IN THERMAL EQUILIBRIUM WITH CONTAINING REGION

BACKGROUND

Current memory technologies such as DRAM (dynamic random access memory), SRAM (static RAM), and HAND flash are approaching their scalability limits. There is a growing need for new memory technologies that can meet increasing performance requirements of future memory applications. Memristor technology has the potential to satisfy this need. Memristors rely on drift of mobile charges upon application of an electric field. A memristor comprises a conducting channel disposed between two contacts. A large number of memristors may be fabricated in a crossbar configuration. Memristors offer con-volatile and multiple-state data storage. They are stackable in three dimensions and compatible with CMOS technology. Memristors fabricated of materials such as oxides of tantalum have shown high endurance, in some eases exceeding $10^{12}$ on-off cycles.

BRIEF DESCRIPTION OF THE DRAWINGS

The figures are not drawn to scale. They illustrate the disclosure by examples.

DETAILED DESCRIPTION

Figure 1:
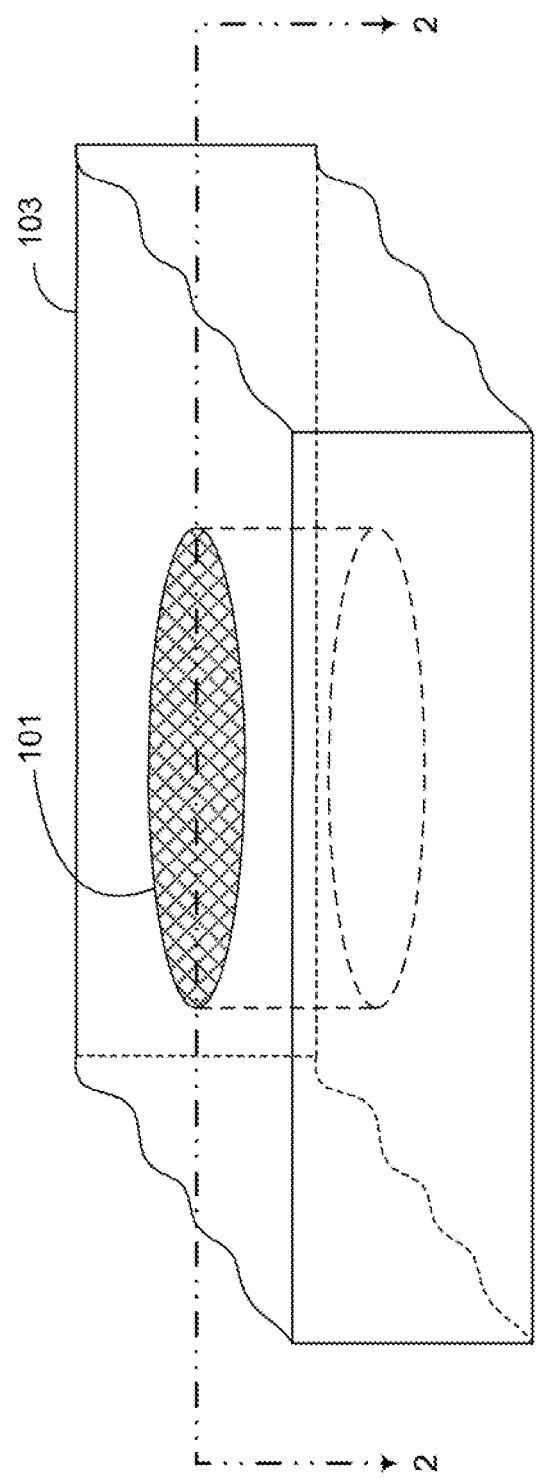
FIG. 1 is a perspective view of an example of a memristor with, a channel region in thermal equilibrium with a containing region.

Illustrative examples and details are used in the drawings and in this description, but other configurations may exist and may suggest themselves. Parameters such as voltages, temperatures, dimensions, and component values are approximate. Terms of orientation such as up, down, top, and bottom are used only for convenience to indicate spatial relationships of components with respect to each other, and except as otherwise indicated, orientation with respect to external axes is not critical. For clarity, some known methods and structures have not been described in detail. Methods defined by the claims may comprise steps in addition to those listed, and except as indicated in the claims themselves the steps may be performed in another order than that given. Accordingly, the only limitations are imposed by the claims, not by the drawings or this description.

Memristor fabrication has suffered from relatively low yields and great variability at small dimensions. This has adversely impacted scalability and controllability of fabrication of these devices.

Figure 2:
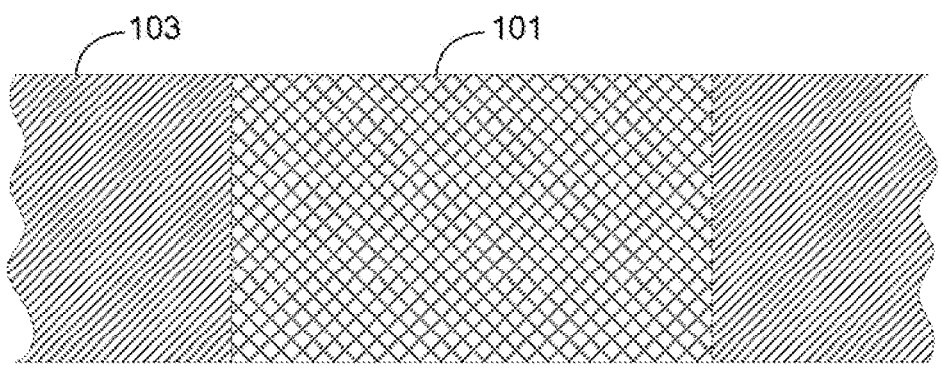
FIG. 2 is a sectional view along the line 2-2 of FIG. 1.

FIGS. 1 and 2 show a memristor that includes a channel region 101 having a variable concentration of mobile ions and a containing region of stoichiometric crystalline material 103, containing and in thermal equilibrium with the channel region. In this example the channel region 101 is shown as generally cylindrical in shape, and the containing region 103 is shown as generally rectangular. However, these shapes are not critical, as will be discussed presently.

"Thermal equilibrium" means the channel, region and the containing region are thermodynamically stable with respect to each other. In other words, they do not react with each other chemically even at elevated temperatures.

The channel region may be formed of any material that works as a conducting channel in a memristor system. The channel region may comprise a core and a gradient region. In some examples the channel region comprises a bistable metal-oxide solid solution and an amorphous oxide phase.

The containing region may consist of any insulating phase that is in thermal equilibrium with the channel region.

In an example of a memristor comprising tantalum, the channel region 101 comprises a metal-oxide solid solution of Ta(O) and an amorphous oxide $TaO_x$, and the containing region comprises stoichiometric crystalline $Ta_2O_5$. Other material systems may be used. An example of a memristor fabricated, of hafnium includes a channel region of a metal-oxide solid solution of Hf(O) and an amorphous oxide $HfO_x$, and, in thermal, equilibrium with the channel region, a containing region of stoichiometric crystalline $HfO_2$.

Figure 3:
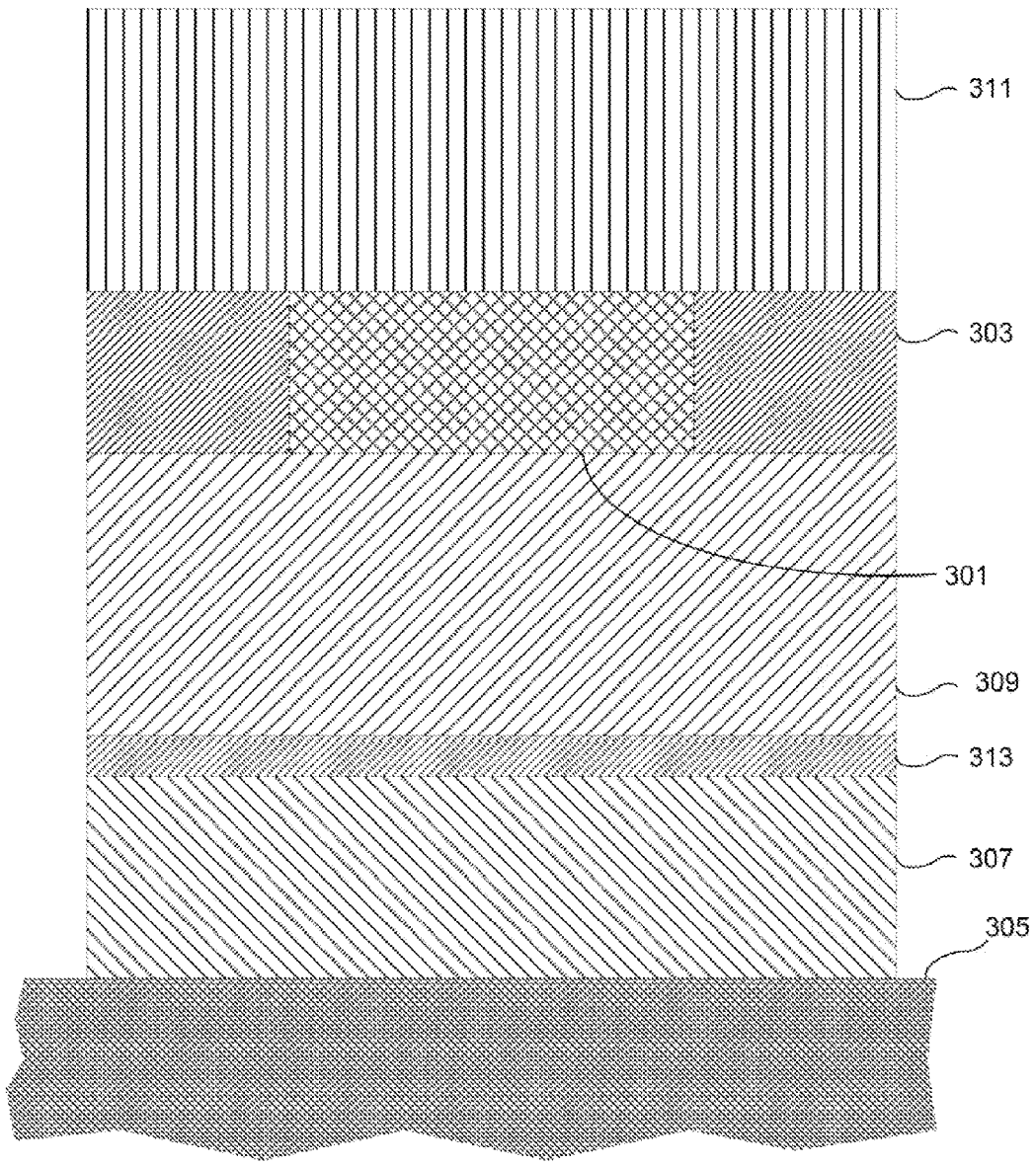
FIG. 3 is a sectional, view of another example of a memristor with a channel region in thermal equilibrium with a containing region.

FIG. 3 shows another example of a memristor with a conducting region 301 and a containing region 303 surrounding and in thermal equilibrium with the channel region. The memristor is fabricated on a substrate 305. An insulating layer 307 is adjacent the substrate and a first contact 309 is adjacent the insulating layer. A second contact 311 is spaced apart from the first contact 309, and the containing region 303 is disposed between the contacts, in some examples an adhesion layer 313, which may be thinner than the other components, is disposed between the insulating layer 307 and the first contact 309.

In some examples the substrate 305 comprises silicon and the insulating layer 307 comprises silicon dioxide. The first contact 309 may comprise platinum and the second contact 311 may comprise tantalum. If an adhesion layer 313 is used, it may comprise titanium.

Dimensions are not critical and may be selected as appropriate for a device under fabrication. In one example the memristor is about 100 micrometers across. The contacts are each about 100 to 400 nanometers thick, the containing region and channel region are between less than 7 up to about 18 nanometers thick, the insulating layer is about 200 nanometers thick, and the adhesion layer (if used) is about one nanometer thick.

Figure 4:
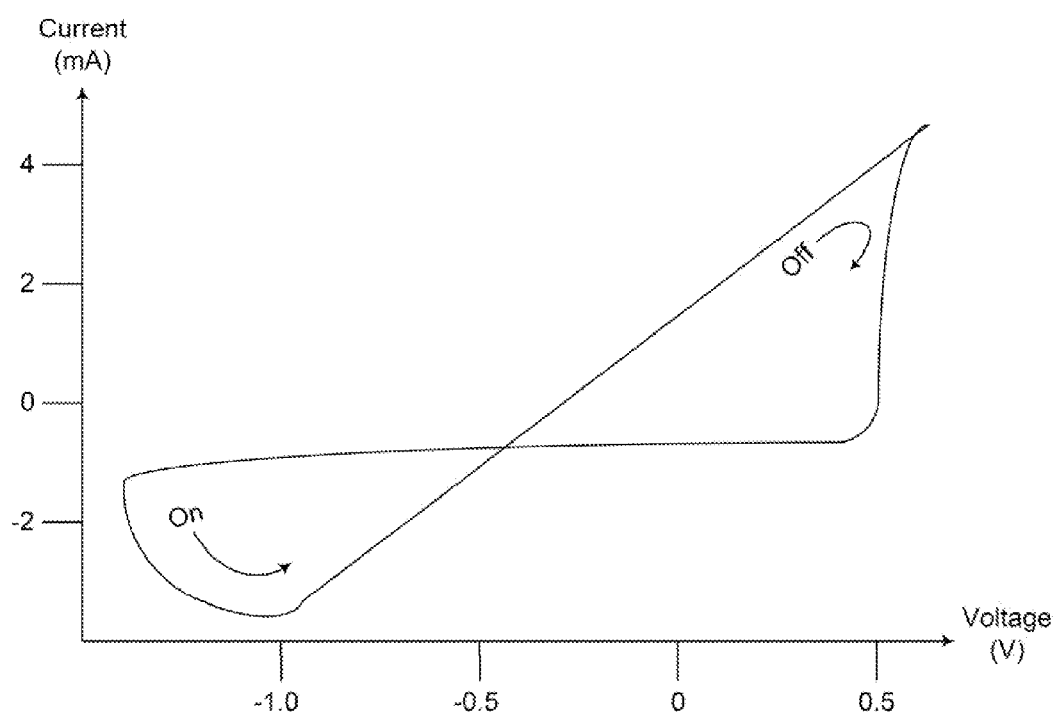
FIG. 4 is a current-voltage (I-V) curve of a memristor with a channel region in thermal equilibrium with a containing region.

FIG. 4 shows a plot of current VS voltage illustrating memristor action, for example action of a memristor with a channel region and a containing region in thermal equilibrium with the channel region.

Figure 5:
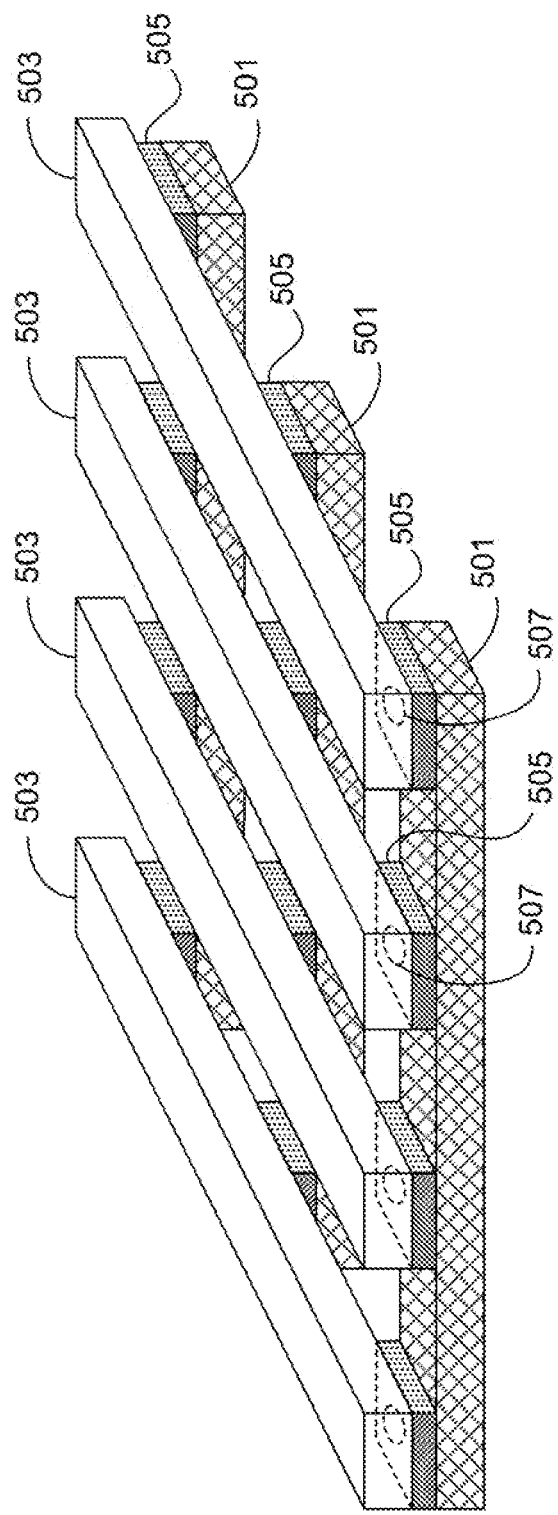
FIG. 5 is a perspective view of a crossbar configuration of memristors each having a channel region in thermal equilibrium with a containing region.

FIG. 5 shows an example of a crossbar memristor structure in which a plurality of first contacts 501 are spaced apart from and generally parallel with each other, and a plurality of second contacts 503 are spaced apart from and generally parallel with each other. The second contacts overly the first contacts, generally at right angles. Memristors with containing regions 505 surrounding channel regions 507 are formed at intersections between the first and second contacts—that is, at points where one of the second contacts crosses over one of the first contacts. An individual memristor located at such an intersection may be accessed by applying appropriate control voltages or currents to those contacts that define the intersection.

Figure 6:
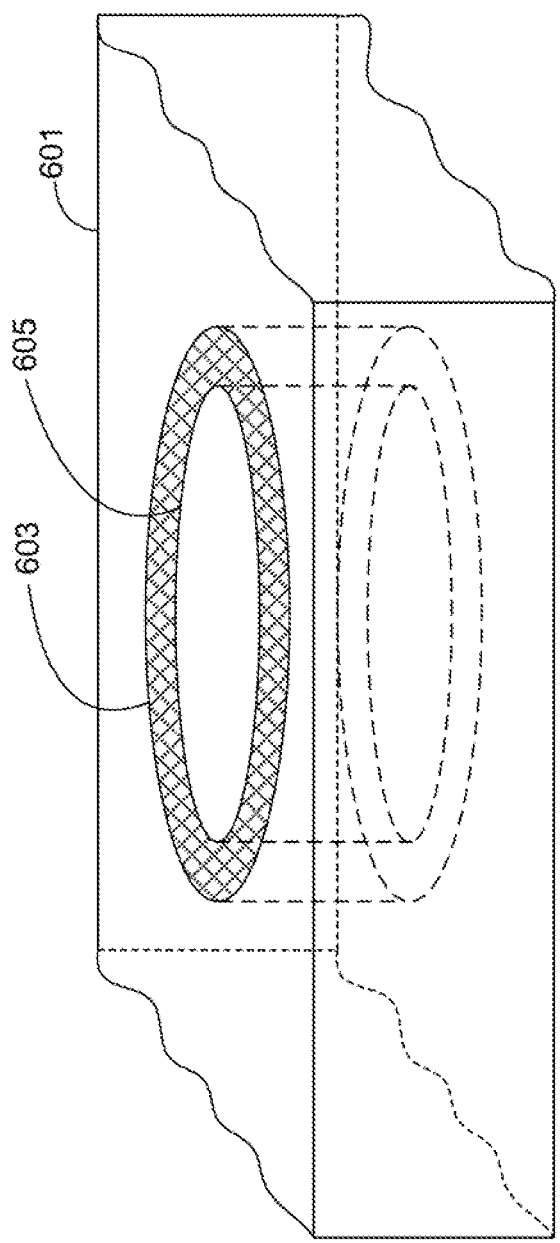
FIG. 6 is a perspective view of an example of a memristor with a cylindrical channel region in thermal equilibrium with a containing region.

As noted above, the shapes of the examples depicted in the drawings are not critical. The containing region need not be rectangular, and the channel region need not be circular. FIG. 6 shows an example having a containing region 601 surrounding a cylindrical channel region 603. The cylindrical channel region 603 has a hollow interior 605. Other shapes of the containing region, the channel, region, or both, may be used as convenient.

Figure 7:
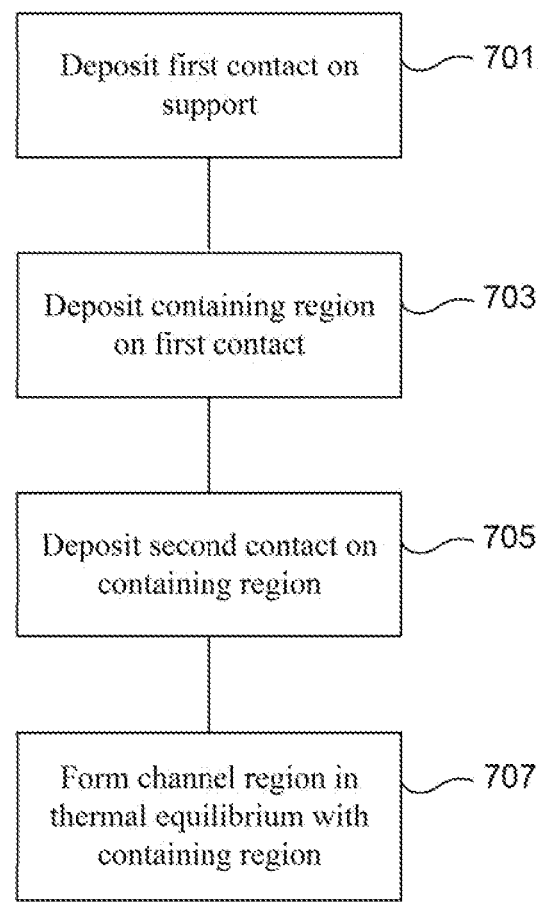
FIG. 7 is a flowchart showing an example of a method of fabricating a memristor with a channel region in thermal equilibrium with a containing region.

An example of a method of fabricating a memristor having a channel region in thermal equilibrium with a containing region is shown in FIG. 7. The method includes depositing (701) a first contact on a support structure, depositing (703) a containing region on the first contact, depositing (705) a second contact on the containing region, and forming (707) a channel region between the contacts and in thermal equilibrium with the containing region. In some examples forming the channel region comprises impressing an electric potential across the contacts to create an electric field through the containing region. In other examples forming the channel region comprises exposing the containing region to an electron beam or an ionized beam, or vacuum annealing the containing region, or subtract roughness engineering. In some examples forming the channel region comprises implanting an impurity (a channel seed) in the containing region.

Memristors with channel regions protected by containing regions with which they are in thermal equilibrium offer improved scalability, endurance, and controllability. Such memristors will better realize the potential of vastly improved memory systems compared with existing memories fabricated with other technologies.

We claim:

1. A memristor with a channel region in thermal equilibrium with a containing region, the memristor comprising:
    a channel region having a variable concentration of mobile ions; and
    a containing region of stoichiometric crystalline material, containing and in thermal equilibrium with the channel region, wherein
    the channel region comprises a hollow core and a gradient region of the variable concentration of mobile ions entirely surrounding the hollow core, and wherein the gradient region comprises a bistable metal-oxide solid solution and an amorphous oxide phase material.

2. The memristor of claim 1 wherein the channel region comprises Ta(O) and $TaO_x$ and the containing region comprises $Ta_2O_5$.

3. The memristor of claim 1 wherein the channel region comprises Hf(O) and $HfO_x$ and the containing region comprises $HfO_2$.

4. A memristor with a channel region in thermal equilibrium with a containing region, the memristor comprising:
    a substrate;
    an insulating layer adjacent the substrate;
    a first contact adjacent the insulating layer;
    a second contact spaced apart from the first contact;
    a containing region disposed between the contacts; and
    a channel region surrounded by the containing region, the first contact, and the second contact, the channel region having a variable concentration of mobile ions and in thermal equilibrium with the containing region, wherein
    the channel region comprises a hollow core and a gradient region of the variable concentration of mobile ions entirely surrounding the hollow core, and wherein the gradient region comprises a bistable metal-oxide solid solution and an amorphous oxide phase material.

5. The memristor of claim 4 wherein the channel region comprises Ta(O) and $TaO_x$ and the containing region comprises $Ta_2O_5$.

6. The memristor of claim 4 wherein the channel region comprises Hf(O) and $HfO_x$ and the containing region comprises $HfO_2$.

7. The memristor of claim 4 and further comprising an adhesion layer between the insulating layer and the first contact.

8. A method of fabricating the memristor of claim 4, the method comprising:
    depositing the first contact on the substrate;
    depositing the containing region on the first contact;
    depositing the second contact on the containing region; and
    forming the channel region between the contacts and in thermal equilibrium with the containing region.

9. The method of claim 8 wherein forming the channel region comprises impressing an electric potential across the contacts to create an electric field through the containing region.

10. The method of claim 8 wherein forming the channel region comprises exposing the containing region to one of an ionized beam and an electron beam.

11. The method of claim 8 wherein forming the channel region comprises vacuum annealing the containing region.

12. A memristor with a channel region in thermal equilibrium with a containing region, the memristor comprising:
    a substrate;
    an insulating layer adjacent the substrate;
    a first contact adjacent the insulating layer;
    a second contact spaced apart from the first contact;
    a containing region disposed between the contacts; and
    a channel region laterally surrounded by the containing region and in thermal equilibrium with the containing region;
    wherein the channel region is connected at opposite ends to the first and second contacts, respectively;
    wherein the channel region comprises mobile ions that move within the channel region under influence of an electric field applied between the first and second contacts to change a resistance of the channel region, wherein
    the channel region comprises a hollow core and a gradient region of variable concentration of the mobile ions entirely surrounding the hollow core, and wherein the gradient region comprises a bistable metal-oxide solid solution and an amorphous oxide phase material.

13. The memristor of claim 12 wherein the channel region comprises Ta(O) and $TaO_x$ and the containing region comprises $Ta_2O_5$.

14. The memristor of claim 12 wherein the channel region comprises Hf(O) and $HfO_x$ and the containing region comprises $HfO_2$.

* * * * *